(12) United States Patent
Chiu et al.

(10) Patent No.: US 9,859,176 B1
(45) Date of Patent: Jan. 2, 2018

(54) SEMICONDUCTOR DEVICE, TEST SYSTEM AND METHOD OF THE SAME

(71) Applicant: TAIWAN SEMICONDUCTOR MANUFACTURING COMPANY LTD., Hsinchu (TW)

(72) Inventors: Tang-Jung Chiu, Hsinchu (TW); Mill-Jer Wang, Hsinchu (TW); Hung-Chih Lin, Hsinchu (TW); Hao Chen, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/339,309

(22) Filed: Oct. 31, 2016

(51) Int. Cl.
| | |
|---|---|
| *H01L 21/66* | (2006.01) |
| *H01L 23/66* | (2006.01) |
| *H01L 23/525* | (2006.01) |
| *G01R 1/073* | (2006.01) |
| *G01R 1/067* | (2006.01) |
| *G01R 31/28* | (2006.01) |

(52) U.S. Cl.
CPC .......... *H01L 22/22* (2013.01); *G01R 1/06772* (2013.01); *G01R 1/07342* (2013.01); *G01R 31/2886* (2013.01); *H01L 22/34* (2013.01); *H01L 23/5256* (2013.01); *H01L 23/66* (2013.01); *H01L 2223/6672* (2013.01)

(58) Field of Classification Search
CPC ...... H01L 23/5256; H01L 22/22; H01L 22/34
See application file for complete search history.

(56) References Cited

U.S. PATENT DOCUMENTS

| | | | |
|---|---|---|---|
| 6,713,828 B1* | 3/2004 | Chavan | B81C 1/00246 257/415 |
| 9,607,680 B2* | 3/2017 | Dabral | G11C 11/4074 |
| 2015/0255142 A1* | 9/2015 | Dabral | G11C 11/4074 365/149 |

* cited by examiner

*Primary Examiner* — Errol Fernandes
(74) *Attorney, Agent, or Firm* — WPAT, P.C., Intellectual Property Attorneys; Anthony King

(57) ABSTRACT

A semiconductor device is disclosed. The semiconductor device includes: a System on Chip (SoC) die; an integrated passive device (IPD); and a first switch, coupled between the SoC die and the IPD; wherein the IPD and the SoC die are disposed in different wafers and bonded together, and the first switch is controlled to disconnect the IPD from the SoC die when the IPD is under a test; and the first switch is controlled to connect the IPD with the SoC die when the IPD is not under the test. A test system for testing an IPD of a semiconductor device and an associated method are also disclosed.

20 Claims, 15 Drawing Sheets

US 9,859,176 B1

SEMICONDUCTOR DEVICE, TEST SYSTEM AND METHOD OF THE SAME

BACKGROUND

In many applications, semiconductor packages combine analog and digital circuitry. To simplify fabrication, the packages are often constructed by combining an integrated passive device (IPD) with other circuits or packaged die to provide the necessary functionality. For example, in high frequency applications, such as radio frequency (RF) wireless communications, IPDs are often contained within the semiconductor device. Examples of IPDs include resistors, capacitors, and inductors. A typical RF system requires multiple IPDs in one or more semiconductor packages to perform the necessary electrical functions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
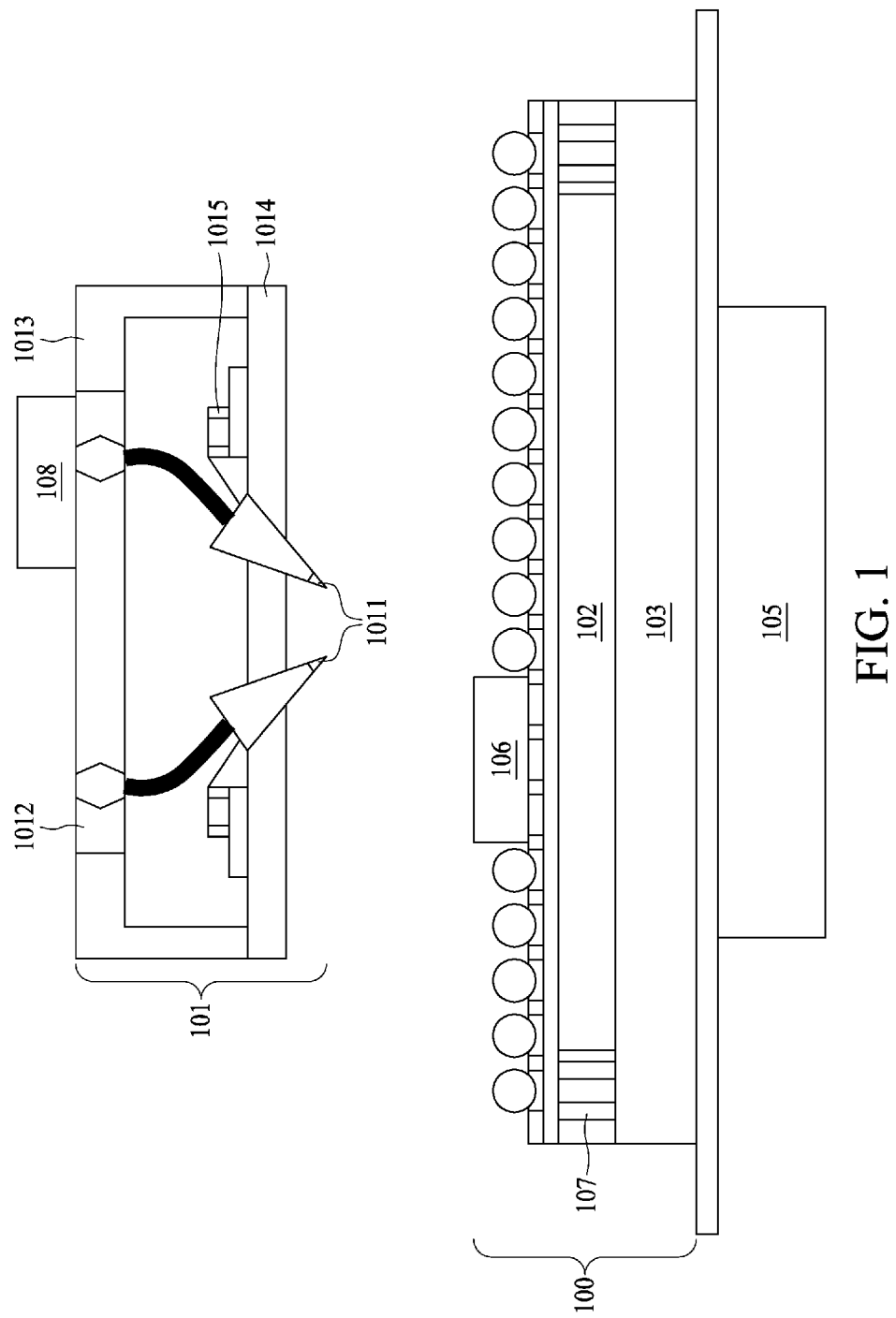
FIG. 1 is a diagram illustrating a test system for an IPD on a product wafer 100 in accordance with a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In many applications, semiconductor packages combine analog and digital circuitry. To simplify fabrication, the packages are often constructed by combining an IPD with other circuits or packaged die to provide the necessary functionality. Generally, the IPD is fabricated over a high resistivity substrate. Unfortunately, the integration of the IPD with one or more die or chips may result in a low-reliability device. For example, the coefficient of thermal expansion (CTE) of the high resistivity substrate of the IPD is often different from that of the integrated die or chips, and the devices expand and contract at different rates as their overall temperature changes. The resulting expansion mismatch may result in damage to the internal structure of the semiconductor package causing reliability problems.

In some embodiments, the semiconductor device may contain IPDs for use in high frequency applications. As described herein, the IPDs may be inductors, capacitors, and resistors. A typical RF system may require multiple IPDs and other high frequency circuits in one or more semiconductor packages to perform the necessary electrical functions. For example, the IPDs contained within semiconductor devices may provide the electrical characteristics needed for high frequency applications, such as resonators, high-pass filters, low-pass filters, band-pass filters, symmetric Hi-Q resonant transformers, and tuning capacitors. The IPDs may be used as front-end wireless RF components, which can be positioned between the antenna and transceiver. The IPD inductor may be a hi-Q balun, transformer, or coil, operating up to 100 Gigahertz. However, this is not a limitation of the present disclosure.

The present disclosure provides a diagnosis test solution (DTS) module for pass/fail determination of an IPD attached to an integrated circuit (IC) on a product wafer. Referring to FIG. 1, which is a diagram illustrating a test system for an IPD 106 on a product wafer 100 in accordance with a first embodiment of the present disclosure. As shown in FIG. 1, the product wafer 100 includes three-dimensional integrated circuits (3D ICs) including the IPD 106 and a System on Chip (SoC) die 102 which are in different wafers and stacked and bonded together. The product wafer 100 may further include a carrier wafer 103 under the IPD 106 and the SoC die 102. Conductive vias 107, e.g., through-silicon vias (TSVs), are formed to define interconnect structures that interconnect the chips in the 3D IC together. The interconnect structures are also connected via TSVs 107 to conductors, e.g., pads, on an outer surface of the 3D IC. The pads are used to connect the 3D IC to external devices and/or for testing the 3D IC before singulation and packaging. It is also possible to test interposers before stacking and bonding the interposers to obtain a 3D IC.

A probe card 101 includes a plurality of RF probes 1011, an RF bracket 1012, a stiffener 1013, a quad card 1014 and an adjustment mylar 1015. The probe card 101 may be coupled to a test system and used for carrying test signals to and from the IPD 106 on the product wafer 100 in order to test the IPD 106. In the exemplary embodiment, the test system may employ a Time Domain Reflectometry (TDR) measurement. A DTS module 108 may be electrically connected with one side of the probe card 101. The plurality of RF probes 1011 may be arranged at the opposite side of the probe card 101 for electrical connection to respective conductors of the product wafer 100 under test supported on a chuck 105. The DTS module 108 is arranged to generate test signals for the RF probes 1011. The test signals are generated by DTS module 108 and transmitted on individual test channels through the RF probes 1011 of the probe card 101 and to the IPD 106 on the product wafer 100. In the exemplary embodiment, the RF probes 1011 may be a high-frequency probe for sensing signal integrity of high speed signals.

The RF bracket 1012 may be used to mechanically support RF cable wirings of the RF probes 1011. The stiffener 1013 may be used to mechanically connect the RF bracket 1012 with the quad card 1014 for the placement of the RF probes 1011. The adjustment mylar may be disposed on the quad card 1014, and used for positioning an XYZ orientation and therefore to optimize a probe-point placement of the RF probes 1011. The chuck 105 may permit relative movements between the supported product wafer 100 and the RF probes 1011. In particular, the chuck 105 is configured to move in the X and Y directions to align the supported product wafer 100 with the RF probes 1011. In some embodiments, the chuck 105 is configured to move in the Z direction as well to move the supported product wafer 100 towards and away from the RF probes 1011 for causing intended electrical contacts between the RF probes 1011 and the supported product wafer 100. However, the detailed configurations of the probe card 101 and the chuck 105 are not limited as above-mentioned. Instead, any other feasible mechanism is implementable in further embodiments.

The product wafer 100 may include a plurality of conductors on a surface thereof. The conductors include, but are not limited to, conductive traces (patterns), bonding pads, bumps, test pads, etc. Conductive traces are for routing electrical signals, power or ground voltages among components and/or integrated circuits included in/on the product wafer 100. Bonding pads and bumps are for electrical and/or mechanical connections to external devices. Test pads are arranged specifically for testing purposes. Any conductor on the surface of the product wafer 100 can be considered as a conductive pad to be brought into contact with one of the RF probes 1011 for receiving test signals to probe the product wafer 100. However, not all the conductors on the surface of the product wafer 100 are used for probing the product wafer 100 in every test. In a certain test, those conductors which are to be used for probing the product wafer 100 are referred to as conductive pads to be tested.

The product wafer 100 further includes electronic components formed therein and/or thereon. Examples of such electronic components include, but are not limited to, transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. The electronic components are interconnected to form integrated circuit devices, such as a logic device, memory device (e.g., SRAM), RF device, input/output (I/O) device, SoC device, combinations thereof, and other suitable types of devices.

Figure 2:
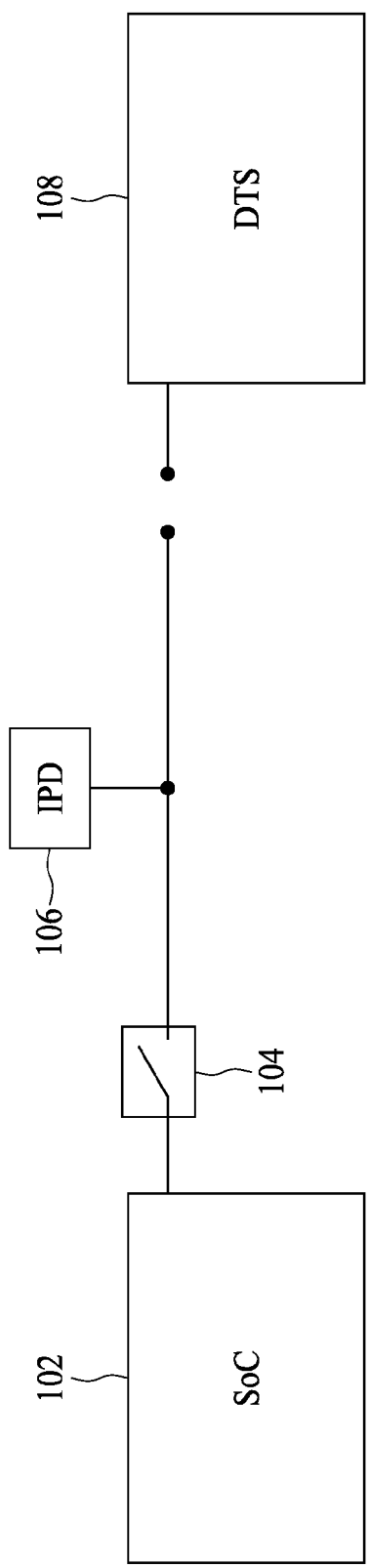
FIG. 2 is a functional block diagram illustrating the test system of FIG. 1 in accordance with the first embodiment of the present disclosure.

FIG. 2 is a functional block diagram illustrating the test system of FIG. 1 in accordance with the first embodiment of the present disclosure. As shown in FIG. 2, the IPD 106 is coupled to the SoC die 102 through a switch 104. In particular, the IPD 106 may be selectively connected to the SoC die 102 according to the switch 104. For example, in a normal operation mode, the switch 104 may be closed; and in an IPD test mode, the switch 104 may be opened so that the IPD 106 can be tested without being affected by the SoC die 102. In the IPD test mode, the DTS module 108 may generate test signals and send to the IPD 106 and sensing a response by contacting the RF probe 1011 (shown in FIG. 1) with the IPD 106.

Figure 3:
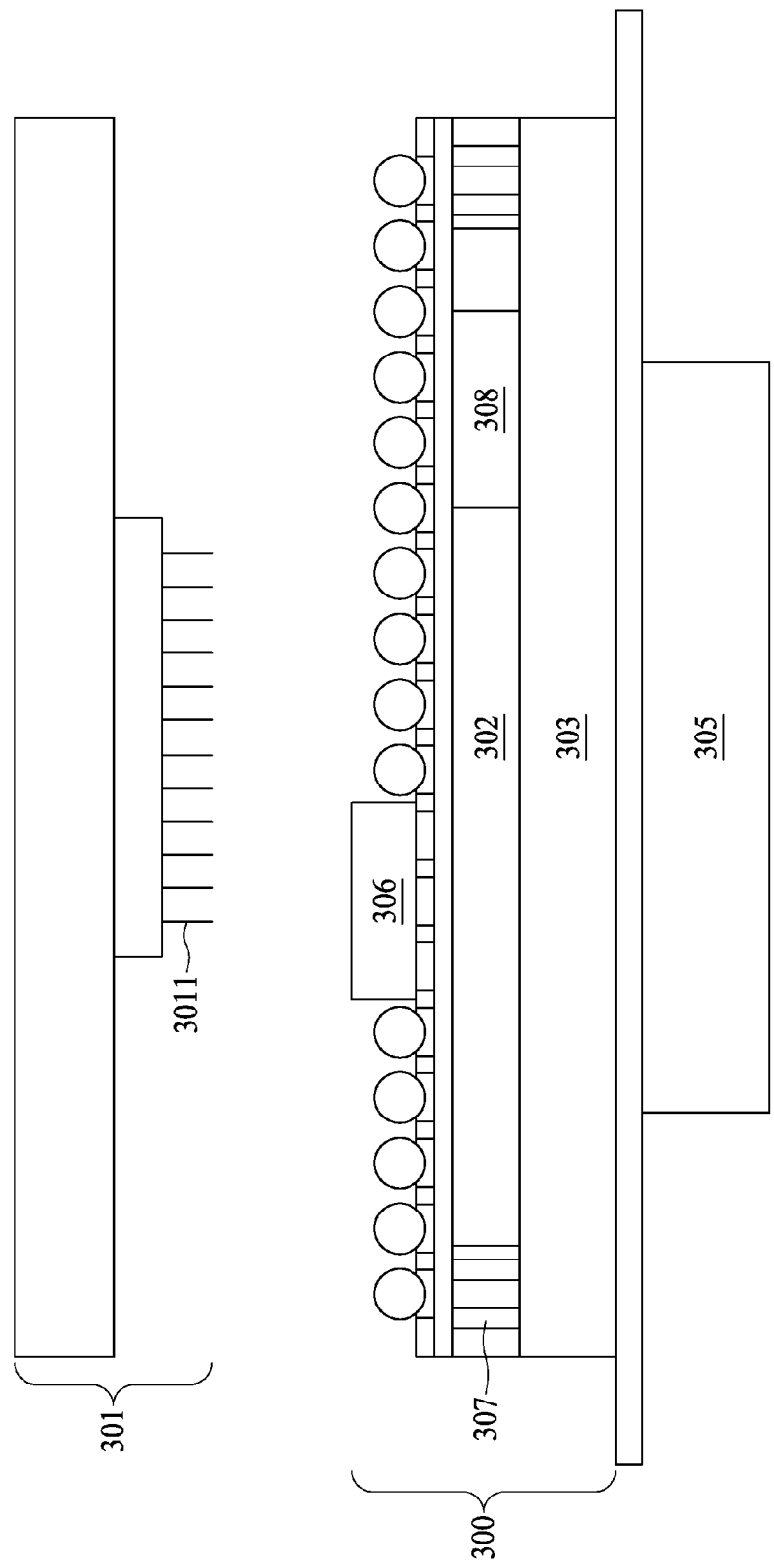
FIG. 3 is a diagram illustrating a test system for an IPD on a product wafer in accordance with a second embodiment of the present disclosure.

FIG. 3 is a diagram illustrating a test system for an IPD 306 on a product wafer 300 in accordance with a second embodiment of the present disclosure. As shown in FIG. 3, the product wafer 300 includes 3D ICs including the IPD 306 and an SoC die 302 which are in different wafers and which are stacked and bonded together. The SoC die 302 may include a DTS module 308. The DTS module 308 may be a built-in-self-test (BIST) circuit arranged to generate test signals for the IPD 306. The product wafer 300 may further include a carrier wafer 303 under the IPD 306 and the SoC die 302. Conductive vias 307, e.g., TSVs, are formed to define interconnect structures that interconnect the chips in the 3D IC together. The interconnect structures are also connected via TSVs 307 to conductors, e.g., pads, on an outer surface of the 3D IC. The pads are used to connect the 3D IC to external devices and/or for testing the 3D IC before singulation and packaging. It is also possible to test interposers before stacking and bonding the interposers to obtain a 3D IC.

The test system includes a probe card 301 having a plurality of probe pins 311, and a chuck 305. A test head (not shown in FIG. 3) may be electrically connectable with one side of the probe card 301. The probe pins 3011 are arranged at the opposite side of the probe card 301 for electrical connection to respective conductors of the product wafer 300 under test supported on the chuck 305. The test head is arranged to generate or route test signals for the probe pins 3011 via the probe card 301. More particularly, the test head is arranged to generate test signals itself, and/or to receive test signals from a testing circuit and then transmit the received test signals to the probe pins 3011 via the probe card 301. The test head includes one or more circuitries which are configured for the above-described purposes and are arranged, in some embodiments, on a printed circuit board (also known as a channel board).

The probe pins 3011 are arranged in an array and are of any configuration suitable for probing the product wafer 300. In some embodiments, the probe pins 3011 are resilient pins, such as those generally known in the art as pogo pins, to ensure proper electrical contract between the probe pins 3011 and the product wafer 300. An exemplary construction of a pogo pin includes two hollow tubes telescopically received on in another, and a spring disposed inside and between the tubes. An interlocking element is provided to prevent the tubes from disengaging from each other under action of the spring. In some embodiments, the probe card 301 is a tip-replaceable probe card which permits replacement of the probe pins 3011 when worn. Such a configuration is advantageous in relatively low replacement and maintenance costs.

The chuck 305 may be similar to the chuck 105 of FIG. 1, and details regarding the chuck 305 may be omitted here for brevity. The product wafer 300 may include a plurality of conductors on a surface thereof. The conductors include, but are not limited to, conductive traces (patterns), bonding pads, bumps, test pads, etc. Conductive traces are for routing electrical signals, power or ground voltages among components and/or integrated circuits included in/on the product wafer 300. Bonding pads and bumps are for electrical and/or mechanical connections to external devices. Test pads are arranged specifically for testing purposes. Any conductor on the surface of the product wafer 300 can be considered as a conductive pad to be brought into contact with one of the probe pins 3011 for allowing the probe pins 3011 to configure and read test signals from the product wafer 300. However, not all the conductors on the surface of the product wafer 300 are used for probing the product wafer 300 in every test. In a certain test, those conductors which are to be used for probing the product wafer 300 are referred to as conductive pads to be tested.

The product wafer 300 further includes electronic components formed therein and/or thereon. Examples of such electronic components include, but are not limited to, transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. The electronic components are interconnected to form integrated circuit devices, such as a logic device, memory device (e.g., SRAM), RF device, input/output (I/O) device, SoC device, combinations thereof, and other suitable types of devices.

Figure 4:
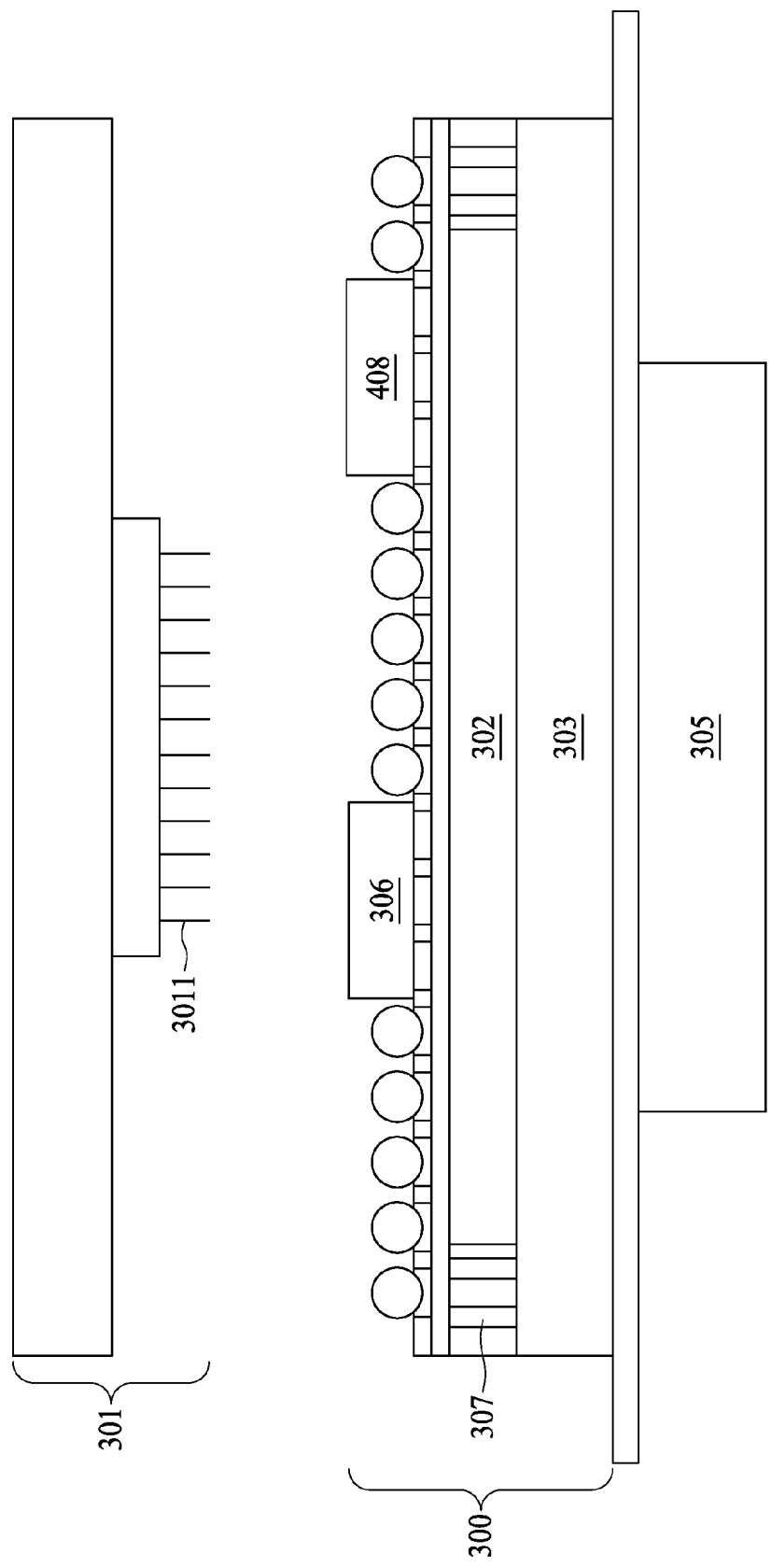
FIG. 4 is a diagram illustrating a test system for an IPD on a product wafer in accordance with a third embodiment of the present disclosure.
Figure 5:
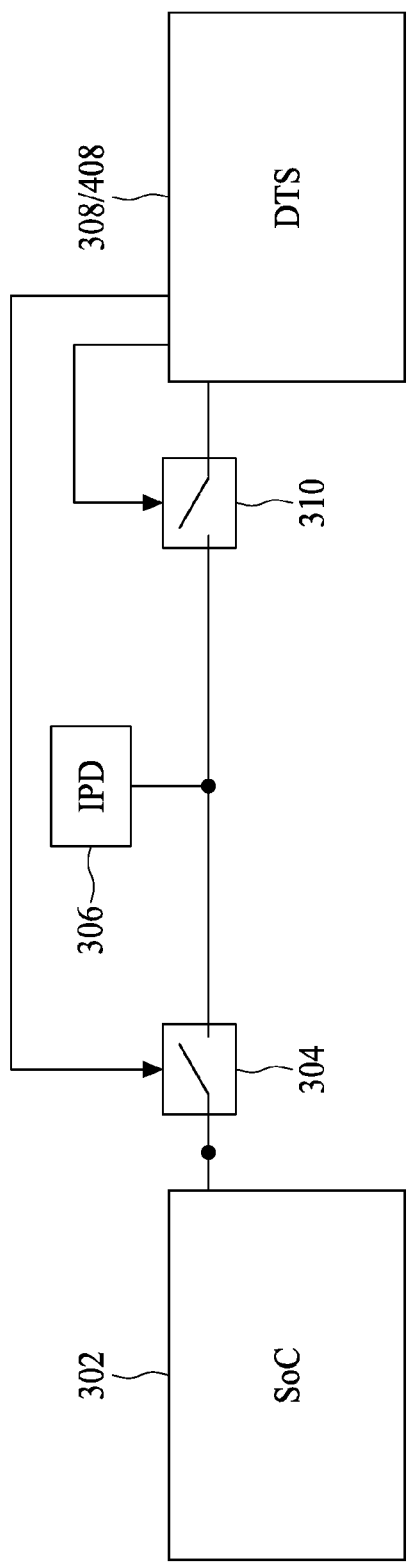
FIG. 5 is a functional block diagram illustrating the test system of FIGS. 3 and 4 in accordance with the first embodiment of the present disclosure.

FIG. 4 is a diagram illustrating a test system for an IPD 306 on a product wafer 300 in accordance with a third embodiment of the present disclosure. Comparing FIG. 4 with FIG. 3, the DTS module 308 is replaced by a DTS module 408. The DTS module 408 may be a built-out-self-test (BOST) circuit arranged to generate test signals for the IPD 306. FIG. 5 is a functional block diagram illustrating the test system of FIGS. 3 and 4 in accordance with the first embodiment of the present disclosure. As shown in FIG. 5, the IPD 306 is coupled to the SoC die 302 through a switch 304; and the IPD 306 is coupled to the DTS module 308/408 as well through a switch 310. In particular, the IPD 306 may be selectively connected to the SoC die 302 according to the switch 304; and the IPD 306 may be selectively connected to the DTS module 308/408 according to the switch 310. For example, in a normal operation mode, the switch 304 may be closed and the switch 310 may be opened so that the SoC die 302 and the IPD 306 can operate without being affected by the DTS module 308/408; and in an IPD test mode, the switch 304 may be opened and the switch 310 may be closed so that the IPD 306 can be tested without being affected by the SoC die 302. In the IPD test mode, the DTS module 308/408 may generate test signals and send to the IPD 306 and sensing a response via interconnectors. In the exemplary, the switches 304 and 310 may be controlled by the DTS module 308/408.

Figure 6:
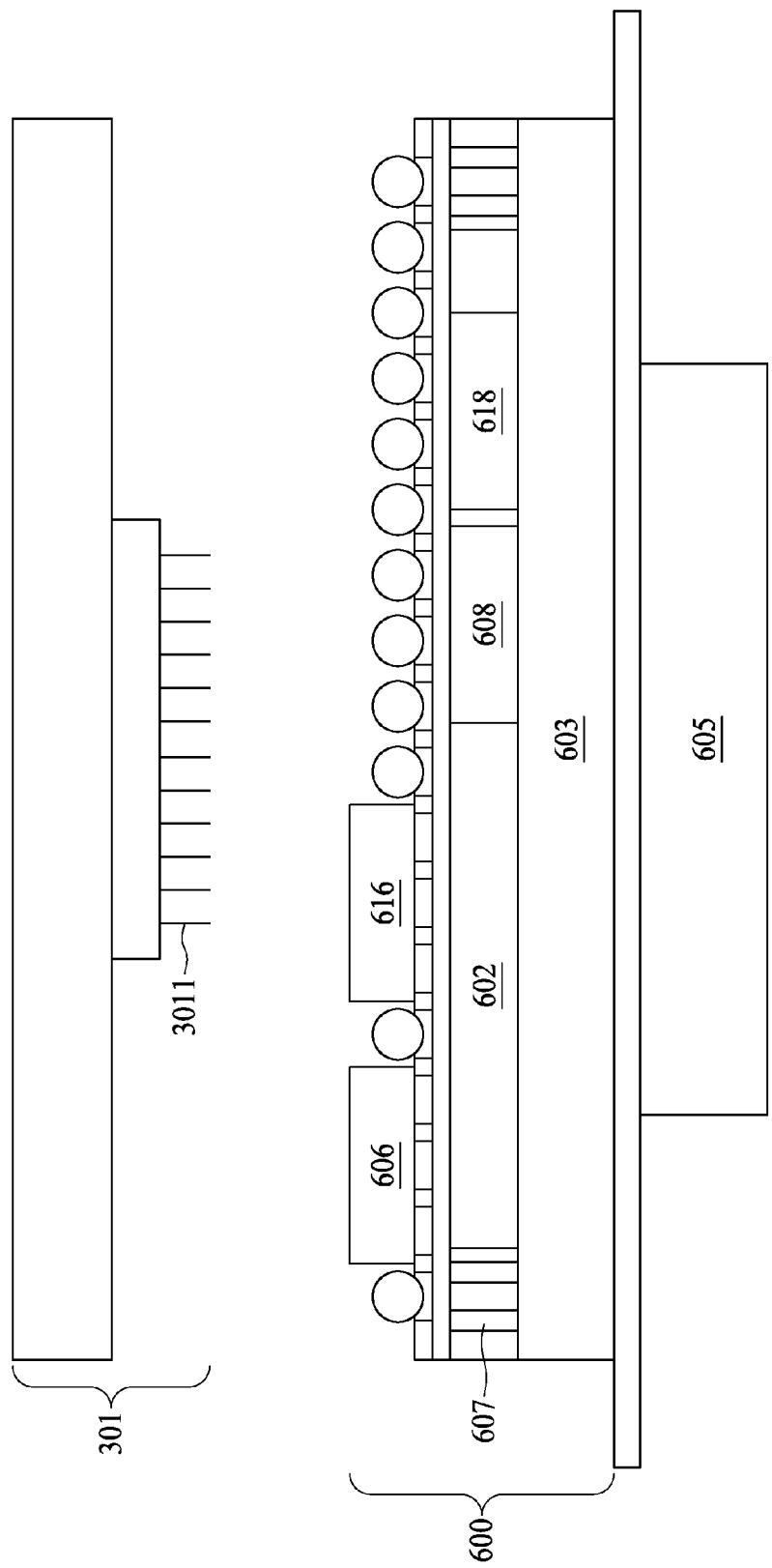
FIG. 6 is a diagram illustrating a test system for an IPD on a product wafer in accordance with a fourth embodiment of the present disclosure.

FIG. 6 is a diagram illustrating a test system for an IPD 606 on a product wafer 600 in accordance with a fourth embodiment of the present disclosure. As shown in FIG. 6, the IPD 606 and a redundant IPD 616 are placed in a side-by-side configuration, and a DTS module 608 and a redundant DTS module 618 corresponding to the IPD 606 and the IPD 616 respectively are placed in a side-by-side configuration as well. In the exemplary embodiment, the IPD 606 may be replaced by the IPD 616 when it malfunctions. In some embodiments, there may be more sets of IPD and DTS module. In some embodiments, the DTS module 608 and the redundant DTS module 618 may be placed in a top-and-bottom configuration by stacking the DTS module 608 and the redundant DTS module 618 in a same layer or in different layer.

Figure 7:
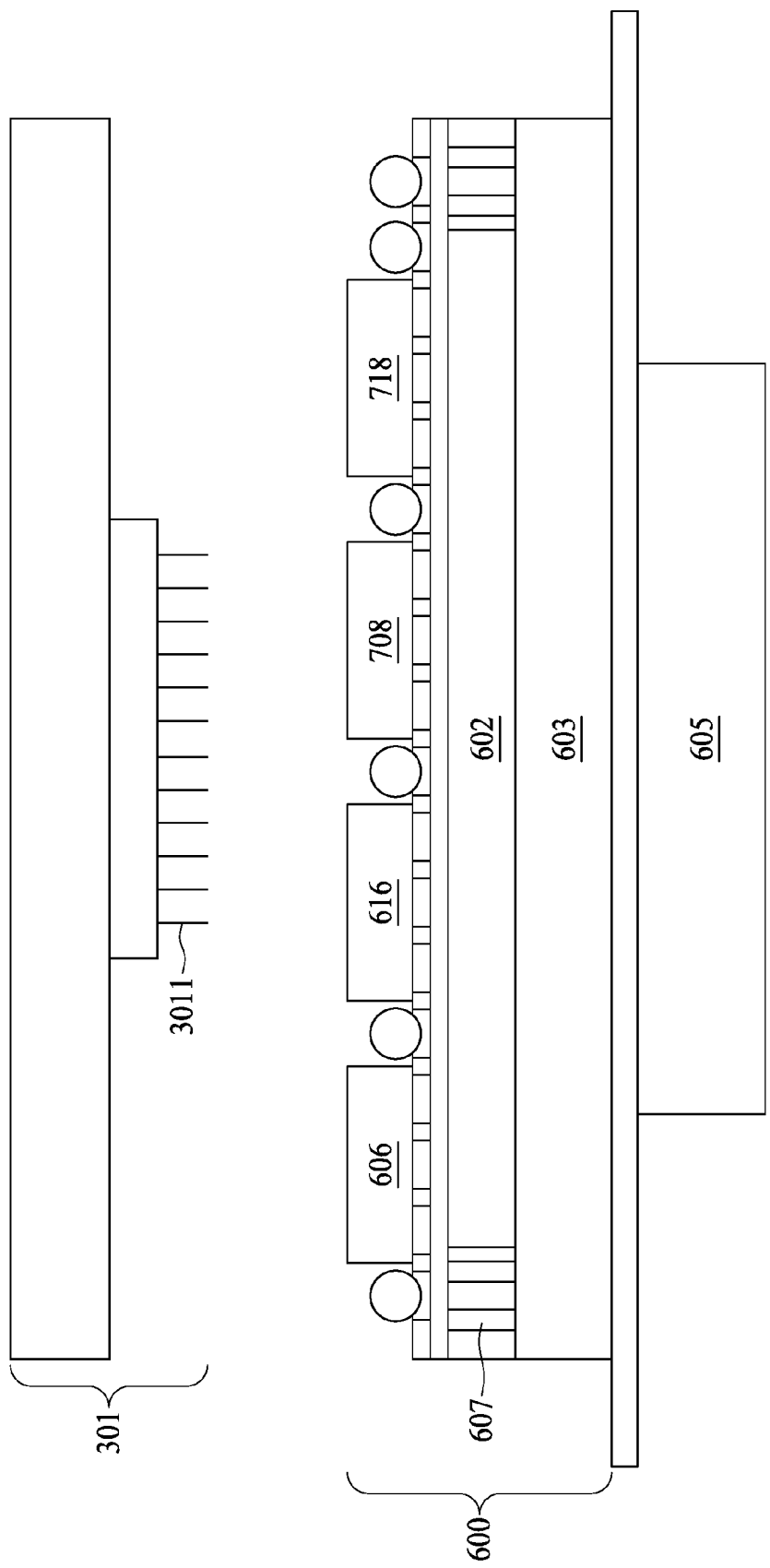
FIG. 7 is a diagram illustrating a test system for an IPD on a product wafer in accordance with a fifth embodiment of the present disclosure.

FIG. 7 is a diagram illustrating a test system for an IPD 606 on a product wafer 600 in accordance with a fifth embodiment of the present disclosure. As shown in FIG. 6, the IPD 606 and a redundant IPD 616 are placed in a side-by-side configuration, and a DTS module 708 and a redundant DTS module 718 corresponding to the IPD 606 and the IPD 616 respectively are placed in a side-by-side configuration as well. In the exemplary embodiment, the IPD 606 may be replaced by the IPD 616 when it malfunctions. In some embodiments, there may be more sets of IPD and DTS module. In some embodiments, the DTS module 708 and the redundant DTS module 718 may be placed in a top-and-bottom configuration by stacking the DTS module 708 and the redundant DTS module 718 in a same layer or in different layer.

Figure 8:
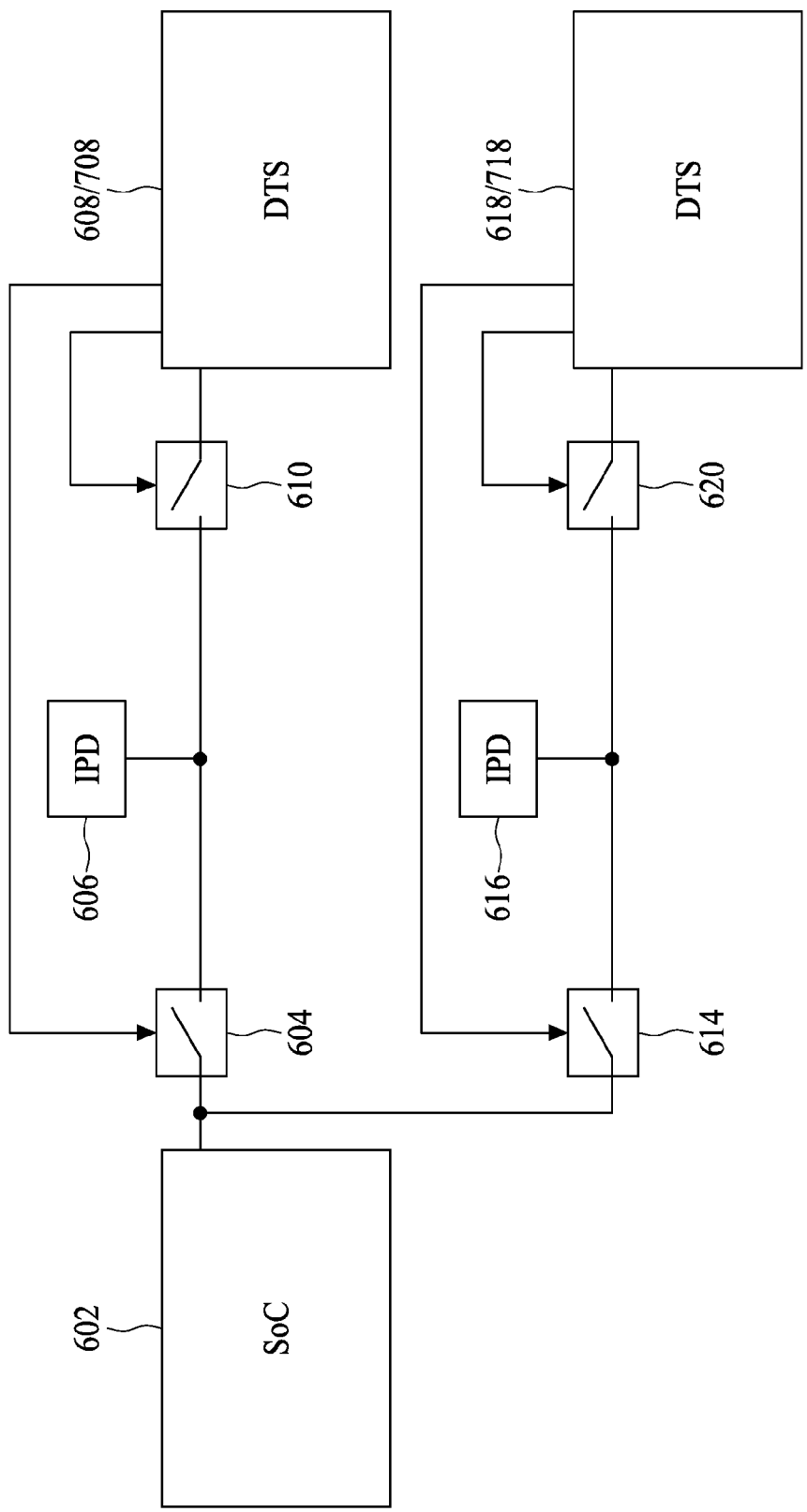
FIG. 8 is a functional block diagram illustrating the test system of FIGS. 6 and 7 in accordance with the first embodiment of the present disclosure.

FIG. 8 is a functional block diagram illustrating the test system of FIGS. 6 and 7 in accordance with the first embodiment of the present disclosure. As shown in FIG. 8, the IPD 606 is coupled to the SoC die 602 through a switch 604; and the IPD 606 is coupled to the DTS module 608/708 as well through a switch 610. In particular, the IPD 606 may be selectively connected to the SoC die 602 according to the switch 604; and the IPD 606 may be selectively connected to the DTS module 608/708 according to the switch 610. The redundant IPD 616 is coupled to the SoC die 602 through a switch 614; and the redundant IPD 616 is coupled to the redundant DTS module 618/718 as well through a switch 620. In particular, the redundant IPD 616 may be selectively connected to the SoC die 602 according to the switch 614; and the redundant IPD 616 may be selectively connected to the redundant DTS module 618/718 according to the switch 620. For example, in a normal operation mode, the switch 604 may be closed and the switches 610 may be opened so that the SoC die 602 and the IPD 606 can operate without being affected by the DTS module 608/708; and in an IPD test mode, the switch 604 may be opened and the switch 610 may be closed so that the IPD 606 can be tested without being affected by the SoC die 602. In the IPD test mode, the DTS module 608/708 may generate test signals and send to the IPD 606 and sensing a response via interconnectors. When the IPD 606 fails to pass the test, the redundant IPD 616 may be employed to replace the IPD 606 if the IPD 616 passes the test. In the exemplary, the switches 604 and 610 may be controlled by the DTS module 608/708; and the switches 614 and 620 may be controlled by the DTS module 618/718. As described herein, the switches mentioned above may be an electrically programmable fuse (e-fuse).

Figure 9:
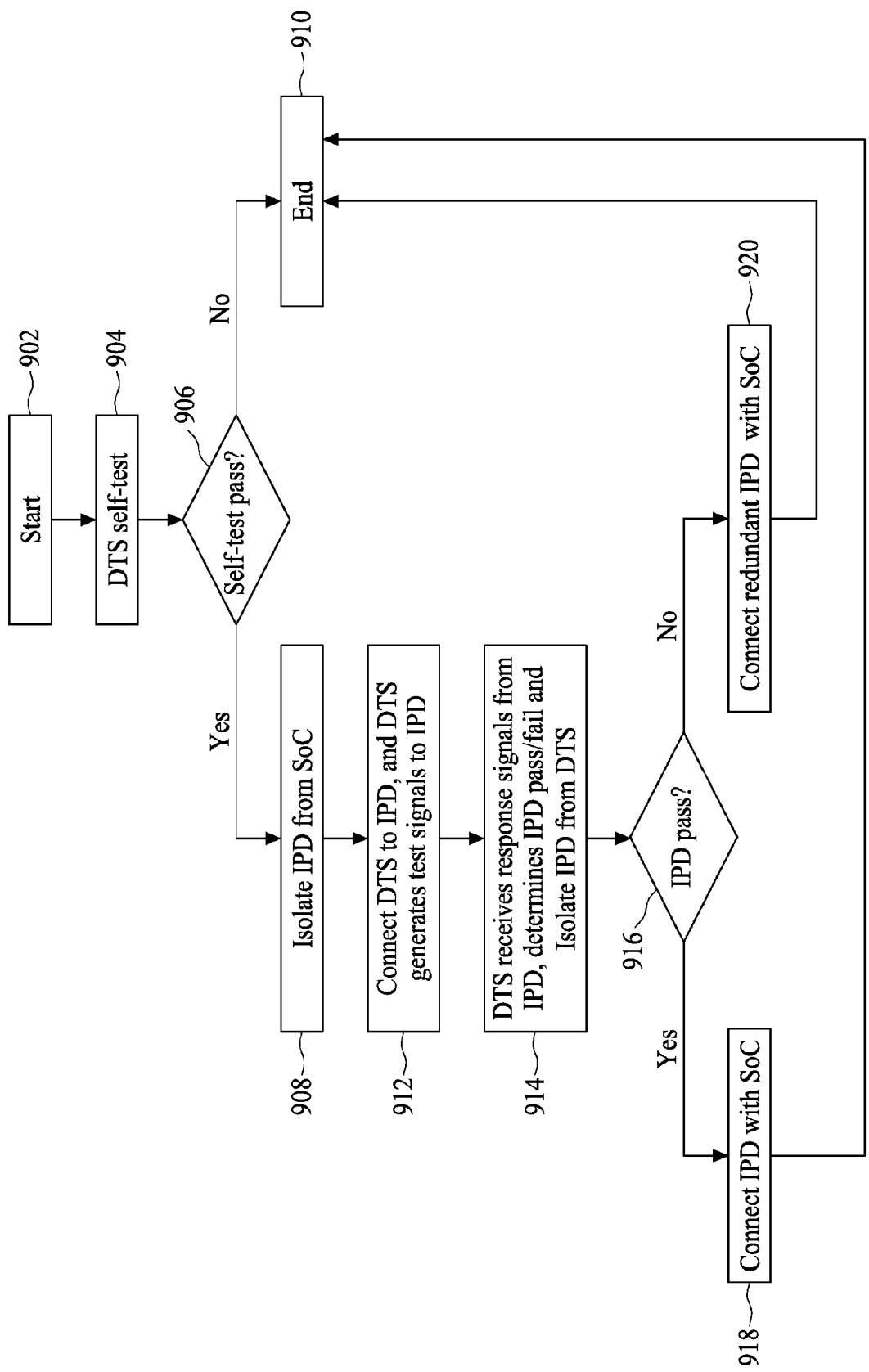
FIG. 9 is a flow chart illustrating a method for the test system of FIG. 8. The flow starts at operation, and the DTS module and redundant DTS module may optionally start a self-test process according to an embodiment of the present disclosure.

FIG. 9 is a flow chart illustrating a method for the test system of FIG. 8. The flow starts at operation 902, and the DTS module 608/708 and redundant DTS module 618/718 may optionally start a self-test process according to an embodiment of the present disclosure. When the self-test is passed at operation 906, the flow enters operation 908 to start the test of the IPD 606 and redundant IPD 616. First, the IPD 606 and redundant IPD 616 are isolated from the SoC die 602, for example, by closing the switches 604 and 614 according to the control of the DTS module 608/708 and redundant DTS module 618/718 respectively; else when the self-test is failed, the flow may enter operation 910 at which the flow ends. Referring back to the case that the self-test is passed, the isolation mentioned above is performed in order to avoid influence of the SoC die 602 during the test and improving accuracy of the test result obtained in the later operations. After isolating the IPD 606 and redundant IPD 616 from the SoC die 602, the IPD 606 and redundant IPD 616 is connected to the DTS module 608/708 and redundant DTS module 618/718 respectively, for example, by closing the switches 610 and 620 according to the control of the DTS module 608/708 and redundant DTS module 618/718 respectively in operation 912. In that way, the DTS module 608/708 and redundant DTS module 618/718 are allowed to generate test signals to the IPD 606 and redundant IPD 616 respectively in order to, for example, measure current leakage. In some embodiments, current leakage may be measured with the IPD 606 and redundant IPD 616 disconnected from the DTS module 608/708 and redundant DTS module 618/718 between the operations 908 and 912 so as to obtain a calibration result.

In operation 914, the DTS module 608/708 and redundant DTS module 618/718 determine if the IPD 606 and redundant IPD 616 pass the test according to the response signal received from the IPD 606 and redundant IPD 616, and isolating the IPD 606 and redundant IPD 616 from the DTS module 608/708 and redundant DTS module 618/718. When the determination indicates that the IPD 606 and redundant IPD 616 pass the test, the IPD 606 is connected to the SoC die 602. However, this is not a limitation of the present disclosure. In some embodiment, either on the IPD 606 and redundant IPD 616 may be connected to the SoC die 602. When the determination indicates that the IPD 606 fail to pass the test, the redundant IPD 616 is connected to the SoC die 602 and vice versa.

Figure 10A:
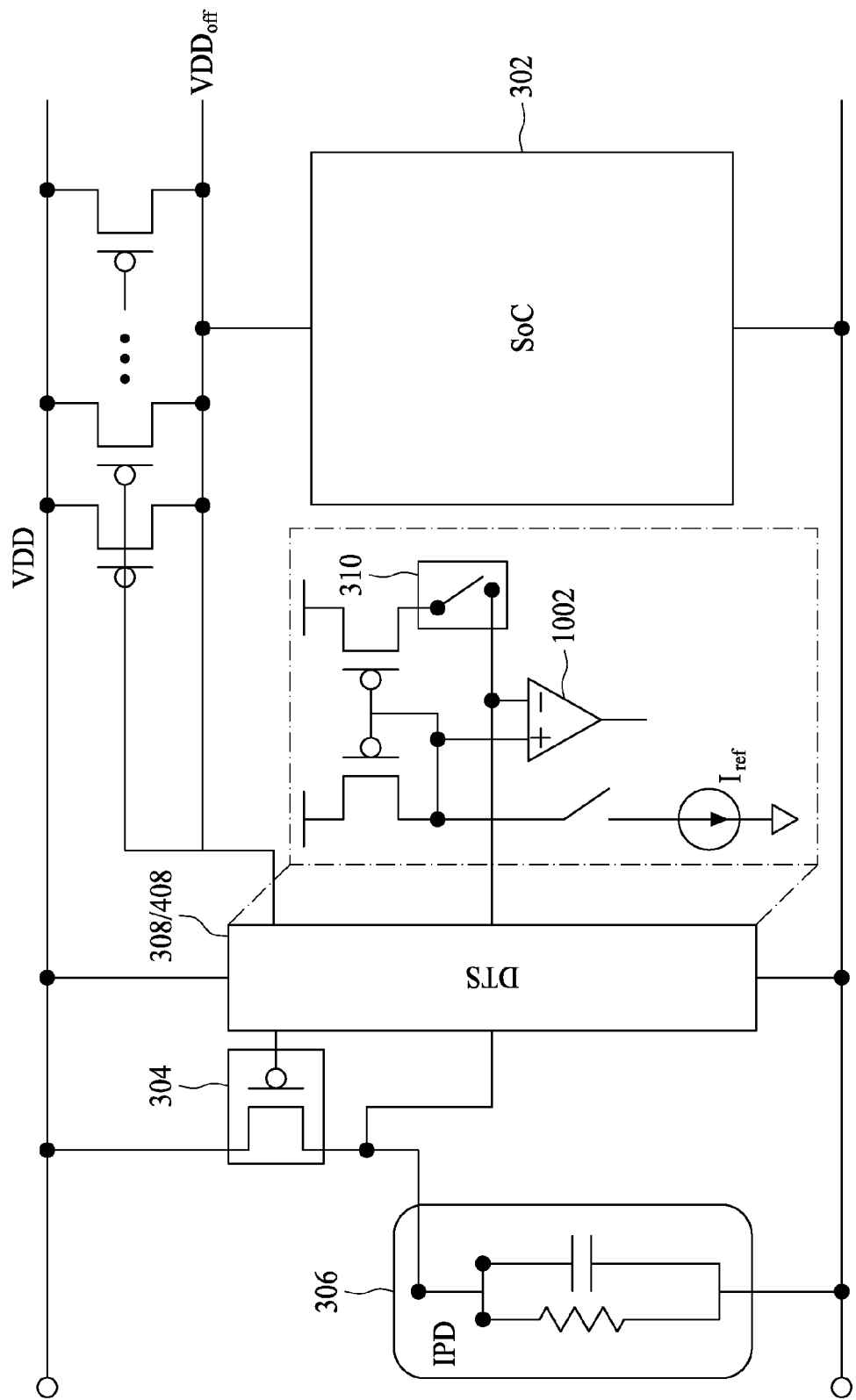
FIG. 10a is a diagram illustrating a detailed circuit structure of at least a portion of the test system of FIG. 5 according to an embodiment of the present disclosure.
Figure 10B:
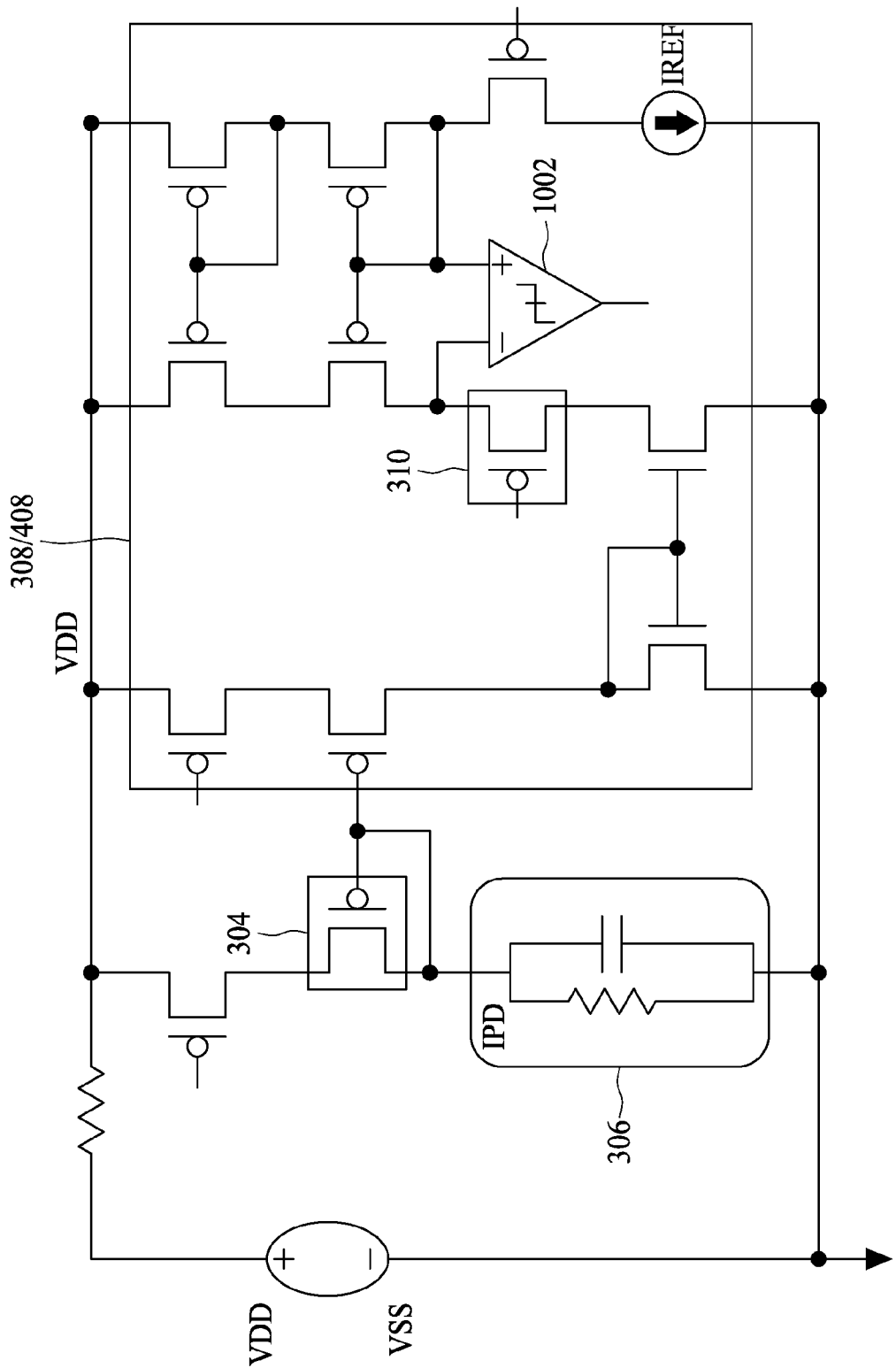
FIG. 10b is a diagram illustrating a detailed circuit structure of at least a portion of the test system of FIG. 5 according to another embodiment of the present disclosure.
Figure 11:
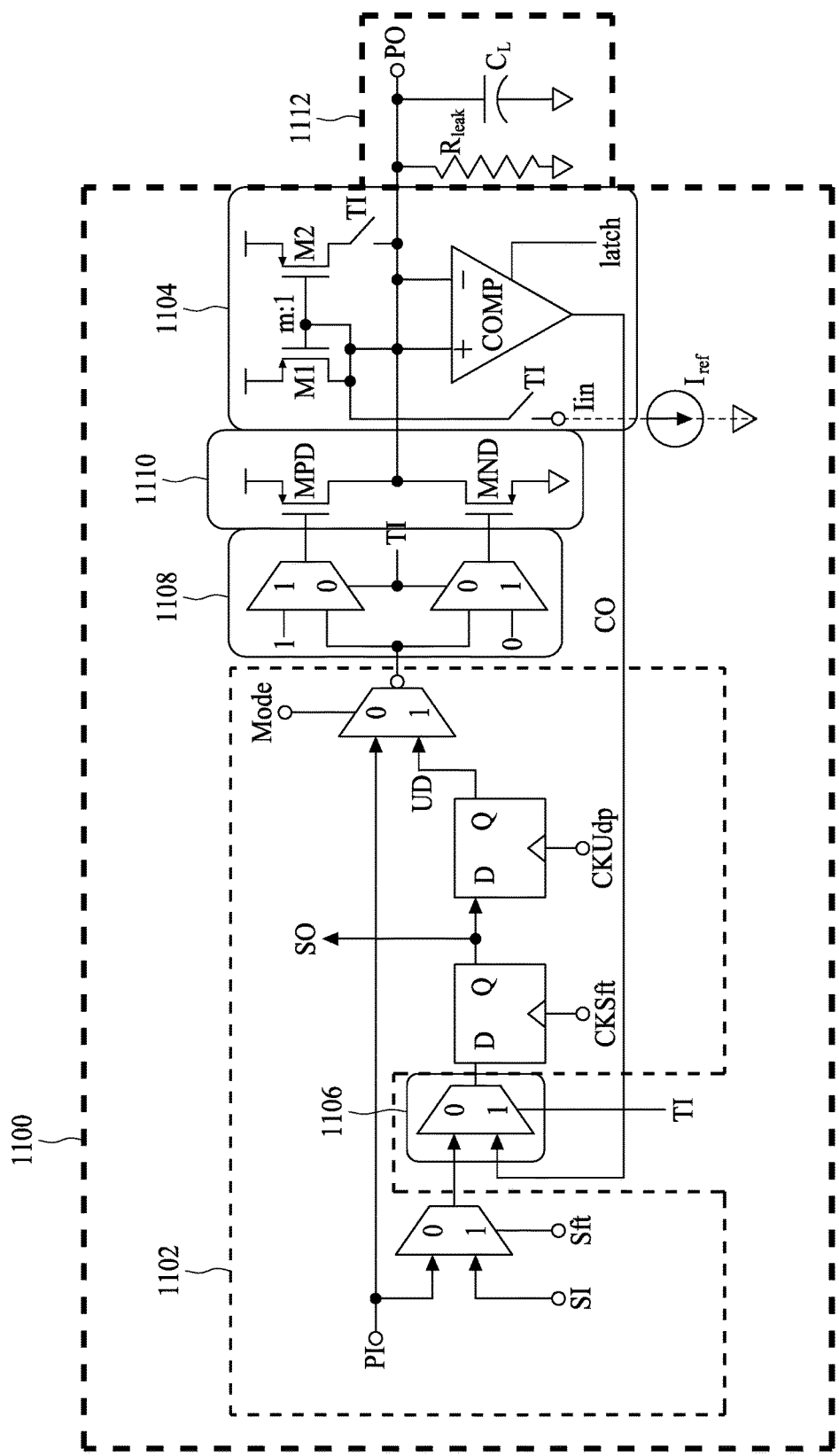
FIG. 11 is a diagram illustrating a hybrid boundary scan cell (HBBSC) with a DTS module according to an embodiment of the present disclosure.
Figure 12:
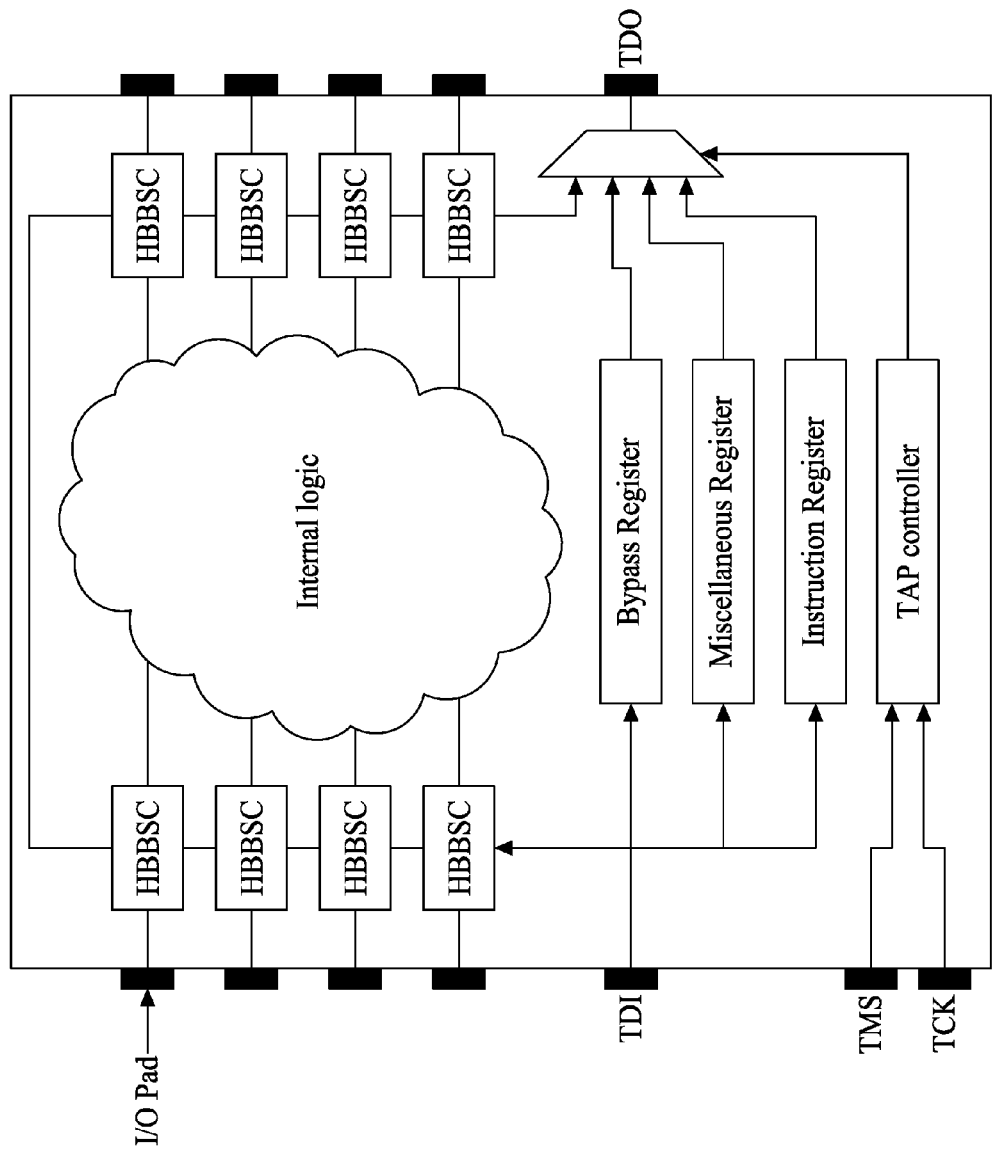
FIG. 12 is a diagram illustrating a chip including the HBBSC according to an embodiment of the present disclosure.

FIG. 10*a* is a diagram illustrating a detailed circuit structure of at least a portion of the test system of FIG. 5 according to an embodiment of the present disclosure. The DTS module 308/408 may include a comparator 1002. The IPD 306 is represented as an equivalent circuit including a resistor and a capacitor. However, this is not a limitation of the present disclosure. In some embodiments, the equivalent circuit may be an inductor. FIG. 10*b* is a diagram illustrating a detailed circuit structure of at least a portion of the test system of FIG. 5 according to another embodiment of the present disclosure. The DTS module 308/408 may further include current mirror circuits compared with FIG. 10*a*. FIG. 11 is a diagram illustrating a hybrid boundary scan cell (HBBSC) with a DTS module according to an embodiment of the present disclosure. As illustrated in FIG. 11, a DTS module 1104 is integrated into a boundary scan cell (BSC) 1102. The HBBSC 1100 further includes mux units 1106, 1108 and a driver 1110 in order to complete the functionality of the HBBSC 1100 for an IPD 1112. The application of the HBBSC 1100 in a chip is illustrated in FIG. 12.

Figure 13A:
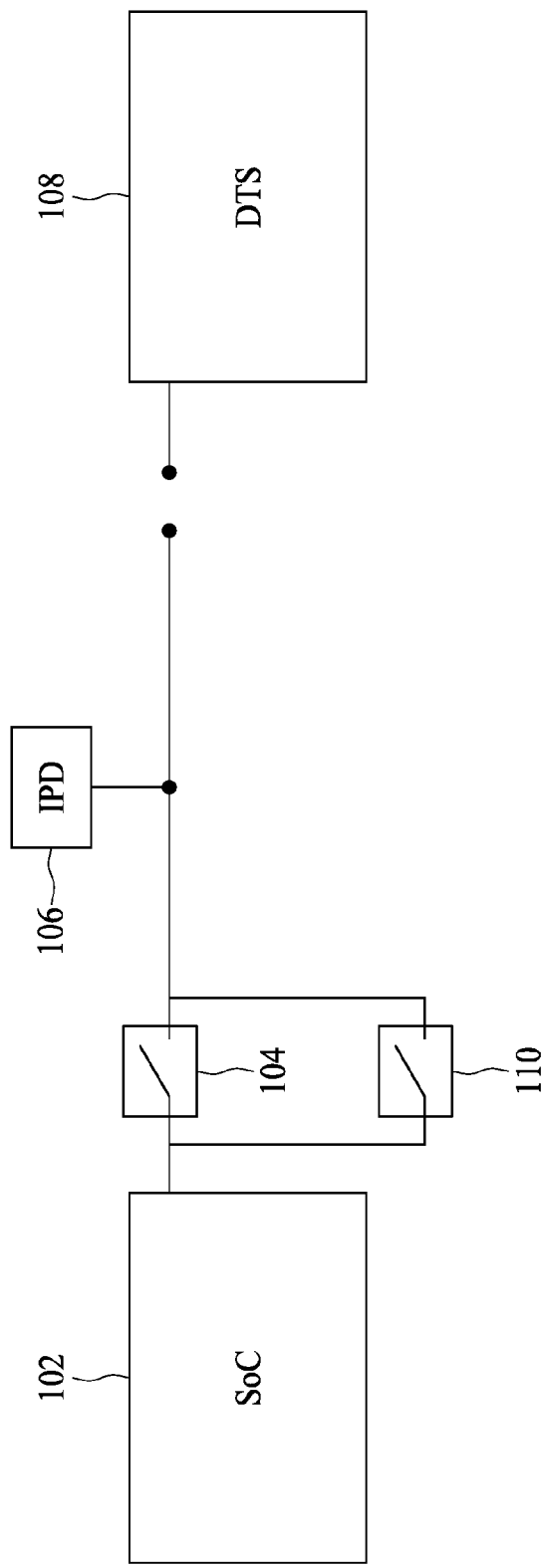
FIG. 13a is a functional block diagram illustrating the test system of FIG. 1 bonded to a PCB in accordance with an embodiment of the present disclosure.

FIG. 13*a* is a functional block diagram illustrating the test system of FIG. 1 bonded to a printed circuit board (PCB) in accordance with an embodiment of the present disclosure. When a product wafer having an IPD, for example the product wafer 100, passes the IPD test, the product wafer may be bonded to a PCB. When the switch 104 is controlled to be closed to couple the IPD 106 to the SoC die 102, the switch 104 still contribute a high resistance. In order to avoid the high resistance path between the IPD 106 and the SoC die 102, a low resistance switch 110 may be provided on the PCB. The low resistance switch 110 may be a relay having an equivalent resistance lower than about 1 ohm when closed.

Figure 13B:
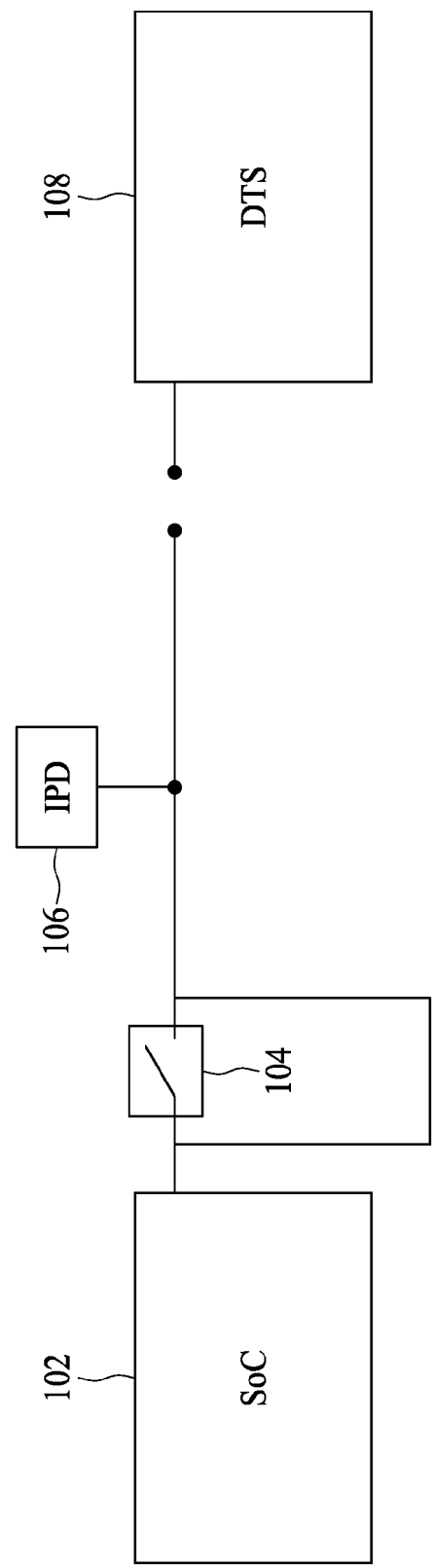
FIG. 13b is a functional block diagram illustrating the test system of FIG. 1 bonded to a substrate in accordance with an embodiment of the present disclosure.

FIG. 13*b* is a functional block diagram illustrating the test system of FIG. 1 bonded to a substrate in accordance with an embodiment of the present disclosure. When a product wafer having an IPD, for example the product wafer 100, passes the IPD test, the product wafer may be bonded to a substrate. In order to avoid the high resistance path between the IPD 106 and the SoC die 102, a low resistance path may be provided in the substrate to simply couple the IPD 106 to the SoC die 102 via a conductive line. Please note that the embodiment shown in FIG. 13*b* may be applied to the PCB case shown in FIG. 13*a* as well.

Some embodiments of the present disclosure provide a semiconductor device. The semiconductor device includes: a System on Chip (SoC) die; an integrated passive device (IPD); and a first switch, coupled between the SoC die and the IPD; wherein the IPD and the SoC die are disposed in different wafers and bonded together, and the first switch is controlled to disconnect the IPD from the SoC die when the IPD is under a test; and the first switch is controlled to connect the IPD with the SoC die when the IPD is not under the test.

Some embodiments of the present disclosure provide a test system for testing an IPD of a semiconductor device, wherein the IPD is disposed in a wafer bonded to another wafer including a SoC die. The test system includes: a probe card; and a diagnosis test solution (DTS) module, arranged to generate a test signal to the IPD and receive a response from the IPD; wherein the DTS module is electrically connected with a first side of the probe card.

Some embodiments of the present disclosure provide a method for testing an integrated passive device (IPD) of a semiconductor device, wherein the IPD is disposed in a wafer bonded to another wafer including a System on Chip (SoC) die. The method includes: isolating the IPD from the SoC die; and performing a test on the IPD by generating a test signal to the IPD and receiving a response from the IPD.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
a system on chip (SoC) die;
an integrated passive device (IPD); and
a first switch, coupled between the SoC die and the IPD;
wherein the IPD and the SoC die are disposed in different wafers and bonded, and the first switch is controlled to disconnect the IPD from the SoC die when the IPD is under a test; and the first switch is controlled to connect the IPD with the SoC die when the IPD is not under the test.

2. The semiconductor device of claim 1, further comprising:
a diagnosis test solution (DTS) module, arranged to generate a test signal to the IPD and receive a response from the IPD; and
a second switch, coupled between the DTS module and the IPD;
wherein the first switch and the second switch are controlled by the DTS module.

3. The semiconductor device of claim 2, wherein the second switch is controlled to connect the IPD with the DTS module when the IPD is under the test; and the second switch is controlled to disconnect the IPD with the DTS module when the IPD is not under the test.

4. The semiconductor device of claim 3, wherein the DTS module and the SoC die are disposed in a same wafer.

5. The semiconductor device of claim 3, wherein the DTS module and the SoC die are disposed in different wafers.

6. The semiconductor device of claim 1, wherein an equivalent circuit of the IPD includes a resistor and a capacitor.

7. The semiconductor device of claim 1, wherein an equivalent circuit of the IPD includes an inductor.

8. The semiconductor device of claim 2, wherein the second switch includes an electrically programmable fuse.

9. The semiconductor device of claim 2, wherein the DTS module includes a comparator.

10. The semiconductor device of claim 2, wherein the DTS module is integrated with a boundary scan cell (BSC).

11. A semiconductor device, comprising:
a system on chip (SoC) die;
an integrated passive device (IPD);
a first switch, coupled between the SoC die and the IPD;
a diagnosis test solution (DTS) module, arranged to generate a test signal to the IPD and receive a response from the IPD; and
a second switch, coupled between the DTS module and the IPD;
wherein the first switch and the second switch are controlled by the DTS module, and the IPD and the SoC die are disposed in different wafers bonded together.

12. The semiconductor device of claim 11, wherein when the IPD is under a test mode, the first switch is controlled to be open, and the second switch is controlled to be closed.

13. The semiconductor device of claim 11, wherein when the IPD is not under a test mode, the first switch is controlled to be closed, and the second switch is controlled to be open.

14. The semiconductor device of claim 11, wherein the DTS module includes a current mirror circuits.

15. The semiconductor device of claim 11, wherein the DTS module and the SoC die are disposed in different wafers bonded together, and the DTS module and the IPD are at the same side of the SoC die.

16. The semiconductor device of claim 11, wherein the DTS module and the SoC die are disposed in the same wafer bonded together.

17. A semiconductor device, comprising:
a substrate; and
a semiconductor package bonded to the substrate, the semiconductor package including:
a system on chip (SoC) die;
an integrated passive device (IPD);
a first switch, coupled between the SoC die and the IPD;
a diagnosis test solution (DTS) module, arranged to generate a test signal to the IPD and receive a response from the IPD; and
a second switch, coupled between the DTS module and the IPD;
wherein the first switch and the second switch are controlled by the DTS module, and the IPD and the SoC die are disposed in different wafers bonded together.

18. The semiconductor device of claim 17, wherein substrate includes a printed circuit board (PCB).

19. The semiconductor device of claim 17, wherein the substrate includes a third switch coupled between the SoC die and the IPD.

20. The semiconductor device of claim 19, wherein the third switch has an equivalent resistance lower than about 1 ohm when the third switch is closed.

* * * * *